United States Patent
Hou et al.

(10) Patent No.: US 8,687,432 B2
(45) Date of Patent: Apr. 1, 2014

(54) MULTI-BIT RESISTIVE-SWITCHING MEMORY CELL AND ARRAY

(75) Inventors: Tuo-Hung Hou, Hsinchu (TW);
Shih-Chieh Wu, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 282 days.

(21) Appl. No.: 13/351,358

(22) Filed: Jan. 17, 2012

(65) Prior Publication Data
US 2013/0119340 A1  May 16, 2013

(30) Foreign Application Priority Data

Nov. 15, 2011  (TW) .............................. 100141564 A

(51) Int. Cl.
*G11C 7/22*  (2006.01)

(52) U.S. Cl.
USPC .. 365/189.011; 365/148; 257/4; 257/E21.667

(58) Field of Classification Search
USPC ........ 365/100, 189.15, 189.16, 189.011, 148;
257/4, 76, E29.262, 330, 43, 270,
257/E21.662, E21.667, E21.666; 438/381,
438/382
See application file for complete search history.

(56) References Cited

U.S. PATENT DOCUMENTS

| | | | | |
|---|---|---|---|---|
| 7,034,349 | B2 * | 4/2006 | Dimmler et al. | 257/295 |
| 7,378,286 | B2 * | 5/2008 | Hsu et al. | 438/3 |
| 7,778,063 | B2 * | 8/2010 | Brubaker et al. | 365/148 |
| 7,910,429 | B2 * | 3/2011 | Dong et al. | 438/257 |
| 7,933,142 | B2 * | 4/2011 | Okhonin et al. | 365/150 |
| 7,948,295 | B2 * | 5/2011 | Yamashita | 327/415 |
| 2001/0045595 | A1 * | 11/2001 | Black et al. | 257/316 |
| 2007/0007579 | A1 * | 1/2007 | Scheuerlein et al. | 257/315 |
| 2008/0106926 | A1 * | 5/2008 | Brubaker et al. | 365/148 |
| 2008/0219039 | A1 * | 9/2008 | Kumar et al. | 365/148 |
| 2010/0080038 | A1 * | 4/2010 | Awaya et al. | 365/148 |
| 2010/0085796 | A1 * | 4/2010 | Zhu et al. | 365/148 |
| 2012/0182047 | A1 * | 7/2012 | Nomura et al. | 326/54 |

* cited by examiner

*Primary Examiner* — Julio J Maldonado
*Assistant Examiner* — Robert Bachner
(74) *Attorney, Agent, or Firm* — Rosenberg, Klein & Lee

(57) ABSTRACT

This invention proposes a multi-bit resistive-switching memory cell and array thereof. Multiple conduction paths are formed on each memory cell and independent of each other, and each conduction path can be in a high-resistance or low-resistance state, so as to form a multi-bit resistive-switching memory cell. A memory cell array can be formed by arranging a plurality of multi-bit resistive-switching memory cells, and the memory cell array provides a simple, high density, high performance and cost-efficient proposal.

10 Claims, 2 Drawing Sheets

MULTI-BIT RESISTIVE-SWITCHING MEMORY CELL AND ARRAY

FIELD OF THE INVENTION

The present invention relates to a nonvolatile random access memory and array, and in particular relates to multi-bit resistive-switching memory cell and array utilizing localized resistive switching.

BACKGROUND OF THE INVENTION

Resistive-switching nonvolatile random access memory (RRAM) has attracted wide attention and been developed because of numerous advantages including its simple cell structure, low operational voltage, fast switching speed and high integration density.

Usually, RRAM is made in metal-insulator-mental (MIM) configuration, which is simple but can be made by backend manufacturing process only, and cannot be integrated to the frontend process, which increases the manufacturing cost.

Recently, $HfO_2$-based gate dielectrics and Ni gate electrodes are used to form capacitors in a metal-insulator-silicon (MIS) configuration, which was found to have the characteristic of the resistive switching. Ergo, based on the characteristic, the present invention proposes a multi-bit resistive-switching random access memory cell and the detail follows.

SUMMARY OF THE INVENTION

The present invention proposes a multi-bit resistive-switching memory cell, which has multiple conduction paths in a cell and each conduction path can be in high-resistance state (HRS) or low-resistance state (LRS).

The present invention proposes a multi-bit resistive-switching memory cell array, which comprises a plurality of multi-bit resistive-switching memory cells and are arranged in array, and each multi-bit resistive-switching memory cell is capable of providing multiple bits.

A multi-bit resistive-switch memory cell comprises a substrate, a resistive-switching oxide layer and a gate electrode. A conduction channel is formed on the substrate, and a drain and a source are formed on both sides of the conduction channel. The resistive-switching oxide layer is deposited on the conduction channel and the gate electrode on the resistive-switching oxide layer. A source conduction path is formed between the source and the gate, and a drain conduction path between the drain and the gate.

Read voltage ($V_{READ}$) can be applied on the source and the drain to get the state of the source and drain conduction path, respectively, when a gate voltage, less than a threshold voltage, is applied on the gate to cut the conduction channel off.

Set voltage ($V_{SET}$) or reset voltage ($V_{RESET}$) can be applied on the source and drain to set or reset the state of the source and drain conduction path, respectively.

A multi-bit resistive-switching memory cell array comprises a plurality of resistive-switching memory cells, word lines and bit lines. The resistive-switching memory cells are arranged in array with multiple columns and rows, the gates of each row of the resistive-switching memory cells are connected to a word line, the sources of each column of the resistive-switching memory cells to a bit line and the drains to another bit line. This embodiment is proper to a low-bit memory cell array.

A multi-bit resistive-switching memory cell array comprises a plurality of resistive-switching memory cells, first transistors, second transistors, word lines, bit lines and source lines. The resistive-switching memory cells are arranged in array with multiple columns and rows, the gates of each row of the resistive-switching memory cells are connected to a source line. The drain of each resistive-switching memory cell is connected to the source of a first transistor and the drains of the first transistors connected to the resistive-switching memory cells in a column are connected to a bit line. The source of each resistive-switching memory cell is connected to the source of a second transistor and the drains of the second transistors connected to the resistive-switching memory cells in a column are connected to another bit line. The gates of the first and second transistors in a row are connected to a word line.

DESCRIPTION OF THE EXEMPLARY EMBODIMENTS

The present invention proposes a multi-bit resistive-switching memory cell, which has multiple conduction paths in a cell and each conduction path can be in a high resistance state (HRS) or low resistance state (LRS). The conduction path between the gate and the source and the conduction path between the gate and the drain are respectively defined as a source conduction path and a drain conduction path. It is noted that the source conduction path and the drain conduction path are independent for each other, and can be operated independently.

A voltage is applied on the gate, noted as gate voltage ($V_G$), and the value ($|V_G|$) is less than the value of a threshold voltage ($|V_{TH}|$) to cut off the conduction channel, the channel between the source and the drain. In the condition of channel cut-off, a read voltage ($V_{READ}$) is applied on the source or the drain to get the state information of the resistance state of the source or drain conduction path.

A set voltage ($V_{SET}$) is applied on the source or the drain to change the resistance state of the source or drain conduction path into LRS from HRS, and a reset voltage ($V_{RESET}$) is applied to change the resistance state into HRS from LRS.

It is emphatically noted that the conduction channel between the source and the drain is turned on when the source and drain conduction path are in HRS and the gate voltage is larger than the threshold voltage ($|V_G|>|V_{TH}|$), and the multi-bit resistive-switching memory cell can be utilized as a transistor, i.e. the device can be transformed between a transistor and a resistive-switching memory cell.

Many multi-bit resistive-switching memory cells are arranged in an array with multiple row and columns to form a multi-bit resistive-switching memory cell array. Word lines or source lines are connected to the gates of the multi-bit resistive-switching memory cell array and the bit lines to the sources and drains of the multi-bit resistive-switching memory cell array, and the states of the source and drain conduction path can be set, read and reset.

Below, the concept and mechanism of the multi-bit resistive-switching memory cell is explained by using some embodiments of the present invention.

Figure 1:
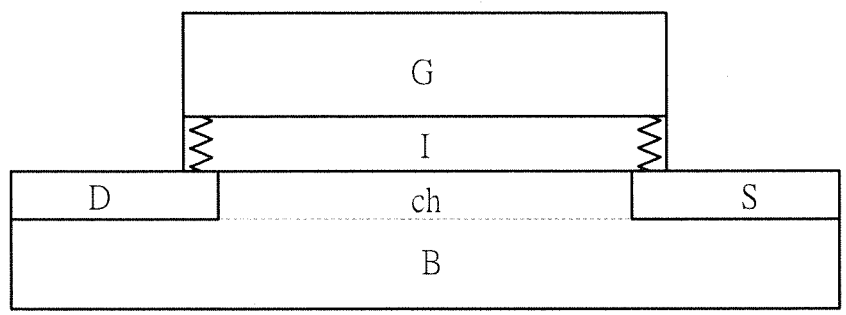
FIG. 1 shows the structure of a multi-bit resistive-switching memory cell according to an embodiment of the present invention.

The structure of a multi-bit resistive-switching memory cell, accompanied with FIG. 1, is introduced. The multi-bit resistive-switching memory cell comprises a substrate (B), a resistive-switching oxide layer (I) and gate electrode (G). A channel (ch) is formed on the substrate (B), and a source (S) and a drain (D) are formed on both sides of the channel (ch). Then the resistive-switching oxide layer (I) is deposited on the channel (ch), and the gate (G) is formed on the resistive-switching oxide layer (I). Another oxide layer, buffer layer, can be formed between the resistive-switching oxide layer (I) and the channel (ch), optionally.

The resistive-switching oxide layer (I) can be implemented by $SiO_2$, $Al_2O_3$, $HfO_2$, $ZrO_2$, $TiO_2$, $Ta_2O_5$, $La_2O_3$, NiO, CuO, ZnO or their derivatives, and the thickness is ranging from 1 to 100 nanometers. The gate (G) can be implemented by Ni, Co, Ag, Ti, Pt, Cu, Au, Hf, Zr, Ta, their silicides or their alloys.

The structure of the multi-bit resistive-switching memory cell is the same as that of a transistor. The gate of the formed transistor is connected to the ground (voltage reference) and a forming voltage ($V_{FORM}$) is initially applied on the source and the drain of the formed transistor to enable the resistive switching of the source and drain conduction path, i.e. the transistor is transformed into a resistive-switching memory cell. It is noted that the forming voltage ($V_{FORM}$) is used one-time at initial and should be larger than or equal to the set voltage ($V_{SET}$). After enabling, the gate is connected to the ground, and if the reset voltage ($V_{RESET}$) is applied on the source or drain then the state of the conduction path is changed from LRS to HRS, if the set voltage ($V_{SET}$) is applied then the state is change from HRS to LRS, and if the read voltage ($V_{READ}$) is applied then the state can be read. It is noted that the resistive-switching memory cell can be transformed to a transistor when the state of the source and drain conduction path are both in HRS and the gate voltage ($V_G$) is larger than the threshold voltage ($V_{TH}$), i.e. $|V_G|>|V_{TH}|$.

If $V_{RESET}$ and $V_{SET}$ have the same polarity ($V_{RESET} \times V_{SET} > 0$) then the resistive switching-memory cell is called unipolar resistive switching, and if have different polarity ($V_{RESET} \times V_{SET} < 0$) then the cell is called bipolar resistive switching. Regardless of the unipolar or bipolar resistive-switching memory cell, the cell provides two conduction paths, i.e. two bits, to form a multi-bit resistive-switching memory cell. The source conduction path and the drain conduction path of a resistive-switching memory cell are independent for each other, i.e. to set, reset or read the state of the source conduction path is independent from to set, reset or read the state of the drain conduction path, and vice versa. Therefore, the bit density is increased.

Figure 2:
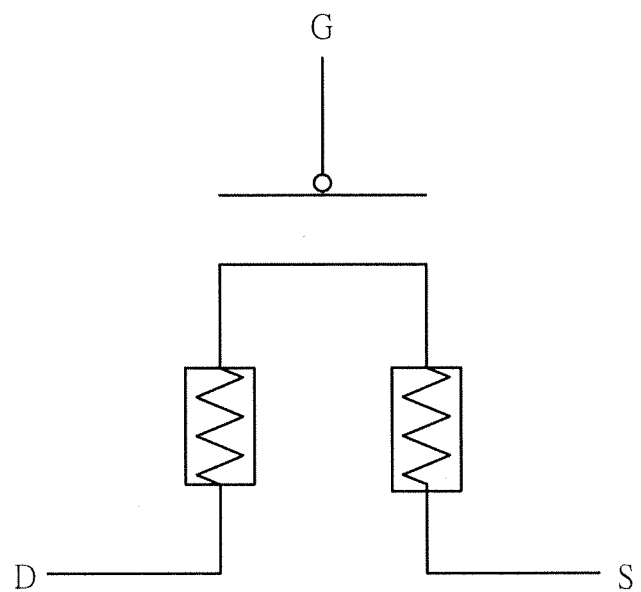
FIG. 2 shows an equivalent circuit of a multi-bit resistive-switching memory cell according to an embodiment of the present invention.

FIG. 2 shows an equivalent circuit of a multi-bit resistive-switching memory cell. The gate is connected to the ground (voltage reference), and the source and drain of the cell connected to a set, reset or read voltage ($V_{SET}$, $V_{RESET}$ and $V_{READ}$) to respectively set, reset or read the resistance state of the source and drain conduction path.

A multi-bit resistive-switching memory cell array is explained as below, accompanied with FIG. 3. A multi-bit resistive-switching memory cell array comprises a plurality of multi-bit resistive switching memory cells (RRAM), word lines WL (including $WL_S$ and $WL_U$, where suffix S means selected and suffix U means unselected), bit lines BL (including $BL_S$ and $BL_U$). The multi-bit resistive-switching memory cells (RRAM) are arranged in multiple rows and columns, and the gates of the RRAM in a row are connected to one of WL, and the sources of the RRAM in a column to one of BL and the drains of the RRAM to another one of BL. Therefore, each cell provides two bits.

The state of one bit selected can be set, reset or read by applying $V_{SET}$, $V_{RESET}$ or $V_{READ}$ through the $BL_S$ and the $WL_S$ should be connected to the voltage reference (the ground). The unselected $WL_U$ and $BL_U$ are biased at a specific voltage or floating to maintain the state.

The embodiment shows a bipolar resistive-switching memory cell, which is similar with a p-channel transistor, and the voltages on word lines and bit lines for different states are shown in Table 1 below. It is noted that the optimal voltages depend on the device design. The voltages in Table 1 are used to explain for better understanding and should not limit the scope of the patent right.

TABLE 1

|  | $WL_S$ | $WL_U$ | $BL_S$ | $BL_U$ |
|---|---|---|---|---|
| $V_{READ}$ | 0 V | open | −0.5 V | −0.5 V |
| $V_{SET}$ | 0 V | −2.5 V | −5 V | −2.5 V |
| $V_{RESET}$ | 0 V | 1.5 V | 3 V | 1.5 V |

Figure 3:
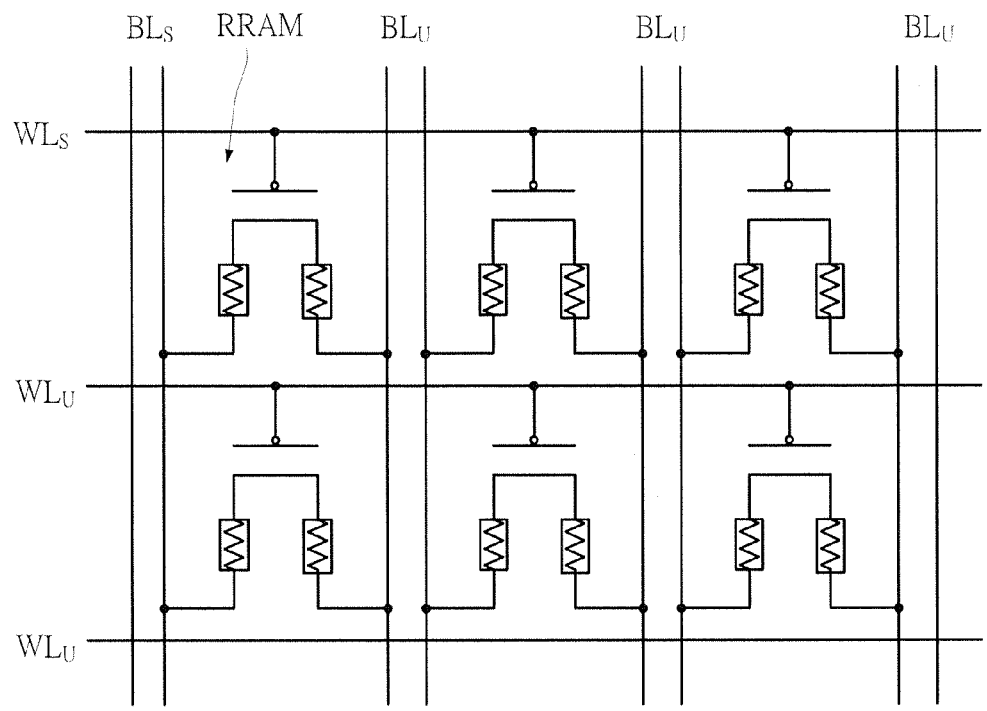
FIG. 3 shows an equivalent circuit of a multi-bit resistive-switching memory cell array according to an embodiment of the present invention.

The embodiment shown as FIG. 3 is suitable for a low-bit memory array, which means an array with a small number of memory cells, but read error due to the cross-talk effect would appear for a high-bit memory array, which means an array with a large number of memory cells. The embodiment shown as FIG. 4 can prevent the cross-talk effect and can be applied to the high-bit array.

Figure 4:
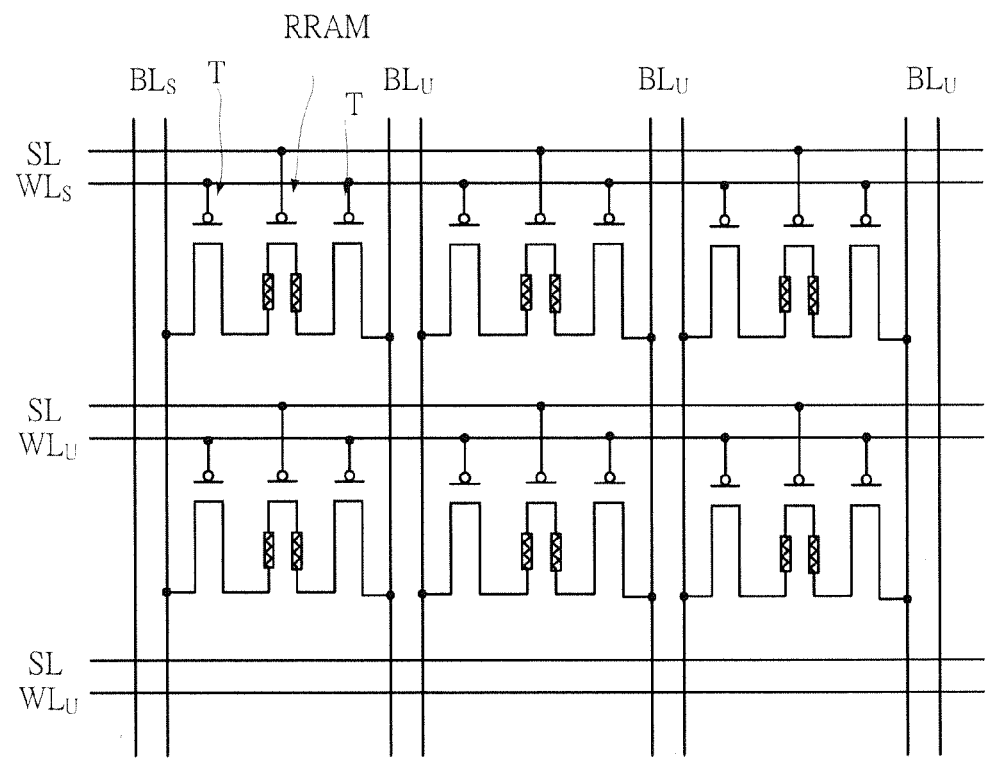
FIG. 4 shows an equivalent circuit of a multi-bit resistive-switching memory cell array according to an embodiment of the present invention.

A multi-bit resistive-switching memory cell array, shown as FIG. 4, comprises a plurality of RRAM, first transistors (T), second transistors (T), WL, BL and source lines (SL). Each first transistor and each second transistor are respectively connected to the drain and source of one resistive-switching memory cell to isolate the cross-talk signals, so the embodiment can be applied to a low-bit or high-bit array.

The multi-bit resistive-switching memory cells are arranged in multiple rows and columns, and the gates of the RRAM cells in a column are connected to one of the SL. The drain of each RRAM is connected to the source of one first transistor and the drains of the first transistors connected to the RRAM cells in a column are connected to one of the BL. The source of each RRAM is connected to the source of one second transistor and the drains of the second transistors connected to the RRAM cells in one column are connected to another one of the BL. The gates of the first and second transistors in one row are connected to one of WL. In this embodiment, three devices (including one RRAM and two transistors) provide two bits.

The embodiment is a bipolar resistive-switching memory cells similar with a p-channel transistor, and the voltages on word lines and bit lines for different states are shown in Table 2 below.

TABLE 2

|  | $WL_S$ | $WL_U$ | $BL_S$ | $BL_U$ | SL |
|---|---|---|---|---|---|
| $V_{READ}$ | −5 V | open | −0.5 V | open | 0 V |
| $V_{SET}$ | −5 V | open | −5 V | open | 0 V |
| $V_{RESET}$ | −5 V | open | 3 V | open | 0 V |

In this embodiment, the gates of the RRAM cells are connected to the ground ($V_G=0$), i.e. the SL are set to be 0V.

When being selected, the voltage on the gates of the transistors should be larger than the threshold voltage to turn on the transistors and, for example, the voltage on $WL_S$ is −5V. The selected bit lines ($BL_S$) can be biased at $V_{SET}$, $V_{RESET}$ or $V_{READ}$ to set, reset or read the resistive state of the source or drain conduction path via the first or second transistor. For unselected RRAM, the corresponding $WL_U$ and $BL_U$ can be floating. This embodiment can prevent the cross-talk effect and can be applied to a high-bit or a low-bit array.

It is emphatically noted that the transistors used in this embodiment can be just a general transistor or, particularly, can be the device same as the RRAM without applying the forming voltage ($V_{FORM}$) to simplify the manufacturing process.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A multi-bit resistive-switching memory cell comprising:
   a substrate,
   a channel, a source and a drain formed on said substrate, and said source and said drain separated and formed on both ends of said channel;
   a resistive-switching oxide layer deposited on said channel; and
   a gate electrode deposited on said resistive-switching oxide layer, wherein a source conduction path is formed between said gate and said source and a drain conduction path is formed between said gate and said drain, and said source conduction path and said drain conduction path are operated independently.

2. A multi-bit resistive-switching memory cell according to claim 1, wherein a state of said source conduction path and a state of said drain conduction path is read by applying a read voltage on said source or said drain respectively and a gate voltage is applied on said gate to cut off said channel, said state of said source conduction path and said state of said drain conduction path is set or reset by applying a set voltage or a reset voltage on said source or said drain respectively.

3. A multi-bit resistive-switching memory cell according to claim 1, wherein said resistive-switching oxide layer is made from $SiO_2$, $Al_2O_3$, $HfO_2$, $ZrO_2$, $TiO_2$, $Ta_2O_5$, $La_2O_3$, NiO, CuO, ZnO or their derivatives.

4. A multi-bit resistive-switching memory cell according to claim 1, wherein the thickness of said resistive-switching oxide layer is ranging from 1 to 100 nanometers.

5. A multi-bit resistive-switching memory cell according to claim 1 further comprising a buffer oxide layer, wherein said buffer oxide layer is disposed between said resistive-switching oxide layer and said channel.

6. A multi-bit resistive-switching memory cell according to claim 1, wherein said gate electrode is made from Ni, Co, Ca, Ag, Ti, Pt, Cu, Au, Hf, Zr, Ta, their sillicides or their alloys.

7. A multi-bit resistive-switching memory cell according to claim 1, wherein a forming voltage is applied to said source and said drain one-time initially to form said source conduction path and said drain conduction path and to enable the resistive switching.

8. A multi-bit resistive-switching memory cell array comprising a plurality of multi-bit resistive-switching memory cells of claim 1, word lines and bit lines, wherein said multi-bit resistive-switching memory cells are arranged in multiple row and columns, gates of said multi-bit resistive-switching memory cells in one row are connected to one of said word lines, sources of said multi-bit resistive-switching memory cells in one column is connected to one of said bit lines and drains of said multi-bit resistive-switching memory cells in one column is connected to another of said bit lines.

9. A multi-bit resistive-switching memory cell array comprising a plurality of multi-bit resistive-switching memory cells of claim 1, first transistors, second transistors, word lines, source lines and bit lines, wherein said multi-bit resistive-switching memory cells are arranged in multiple row and columns, gates of said multi-bit resistive-switching memory cells in one row are connected to one of said source lines, each drain of said multi-bit resistive-switching memory cells in one column is connected to one source of said first transistors and drains of said first transistors in one column are connected to one of said bit lines, each source of said multi-bit resistive-switching memory cells is connected to one source of said second transistors and drains of said second transistors are connected to another one of said bit lines, gates of said first transistors and said second transistors in one row are connected to one of said word lines.

10. A multi-bit resistive-switching memory cell array according to claim 9, wherein said first transistor and said second transistors are made the same as said multi-bit resistive-switching memory cell without applying a forming voltage.

* * * * *